(12) United States Patent
Radke et al.

(10) Patent No.: US 8,271,697 B2
(45) Date of Patent: Sep. 18, 2012

(54) STATE CHANGE IN SYSTEMS HAVING DEVICES COUPLED IN A CHAINED CONFIGURATION

(75) Inventors: William H. Radke, Los Gatos, CA (US); Victor Y. Tsai, Palo Alto, CA (US); James Cooke, Boise, ID (US); Neal A. Galbo, Boca Raton, FL (US); Peter Feeley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 219 days.

(21) Appl. No.: 12/569,661

(22) Filed: Sep. 29, 2009

(65) Prior Publication Data

US 2011/0078336 A1    Mar. 31, 2011

(51) Int. Cl.
  *G06F 3/00*    (2006.01)
  *G06F 13/00*    (2006.01)

(52) U.S. Cl. .................... 710/14; 710/5; 710/8; 710/15; 710/22; 710/29; 710/33; 710/52

(58) Field of Classification Search .................. None
  See application file for complete search history.

(56) References Cited

U.S. PATENT DOCUMENTS

| | | | |
|---|---|---|---|
| 5,535,400 A | 7/1996 | Belmont | |
| 5,613,074 A | 3/1997 | Galloway | |
| 5,881,221 A | 3/1999 | Hoang et al. | |
| 6,199,130 B1 | 3/2001 | Berglund et al. | |
| 6,646,646 B2 | 11/2003 | Peterson et al. | |
| 6,734,865 B1 | 5/2004 | Peterson et al. | |
| 6,741,253 B2 | 5/2004 | Radke et al. | |
| 6,784,889 B1 | 8/2004 | Radke | |
| 6,791,555 B1 | 9/2004 | Radke et al. | |
| 6,816,165 B1 | 11/2004 | Radke | |
| 6,856,529 B1 | 2/2005 | Radke | |
| 6,956,577 B2 | 10/2005 | Radke et al. | |
| 6,963,343 B1 | 11/2005 | Peterson et al. | |
| 7,139,182 B2 | 11/2006 | Radke | |
| 7,180,522 B2 | 2/2007 | Radke et al. | |
| 7,322,002 B2 | 1/2008 | Keays et al. | |
| 7,369,434 B2 | 5/2008 | Radke | |
| 7,379,068 B2 | 5/2008 | Radke | |
| 7,389,465 B2 | 6/2008 | Radke et al. | |
| 7,397,477 B2 | 7/2008 | Radke | |
| 7,444,579 B2 | 10/2008 | Radke et al. | |
| 7,445,156 B2 | 11/2008 | McDonald | |

(Continued)

OTHER PUBLICATIONS

USB Product Family, Dec. 11, 2008, Tyco Electronics, [online, accessed on Jul. 2, 2011], URL: http://www.te.com/catalog/Presentations/USB_Product_Family_1208.pdf.*

*Primary Examiner* — Scott Sun
(74) *Attorney, Agent, or Firm* — Brooks, Cameron & Huebsch, PLLC

(57) ABSTRACT

The present disclosure includes methods, devices, and systems for state change in systems having devices coupled in a chained configuration. A number of embodiments include a host and a number of devices coupled to the host in a chained configuration. The chained configuration includes at least one device that is not directly coupled to the host. The at least one device that is not directly coupled to the host is configured to change from a first communication state to a second communication state responsive to receipt of a command from the host.

22 Claims, 13 Drawing Sheets

U.S. PATENT DOCUMENTS

| | | |
|---|---|---|
| 7,447,961 B2 | 11/2008 | Tan |
| 7,453,723 B2 | 11/2008 | Radke |
| 7,512,909 B2 | 3/2009 | Radke |
| 2005/0076252 A1* | 4/2005 | Birmingham .................. 713/310 |
| 2005/0268203 A1 | 12/2005 | Keays et al. |
| 2006/0026473 A1 | 2/2006 | Patrick Tan |
| 2006/0248434 A1 | 11/2006 | Radke et al. |
| 2007/0162824 A1 | 7/2007 | Radke et al. |
| 2007/0171937 A1* | 7/2007 | Boatright et al. ............. 370/465 |
| 2007/0226592 A1 | 9/2007 | Radke |
| 2008/0037320 A1 | 2/2008 | Radke |
| 2008/0056027 A1 | 3/2008 | Radke |
| 2008/0072120 A1 | 3/2008 | Radke |
| 2008/0082714 A1* | 4/2008 | Hinchey ........................ 710/300 |
| 2008/0092017 A1 | 4/2008 | Keays et al. |
| 2008/0184094 A1 | 7/2008 | Murray et al. |
| 2008/0215930 A1 | 9/2008 | Radke |
| 2008/0267631 A1 | 10/2008 | Collings et al. |
| 2009/0013233 A1 | 1/2009 | Radke |
| 2009/0013234 A1 | 1/2009 | Radke |
| 2009/0019321 A1 | 1/2009 | Radke |
| 2009/0019340 A1 | 1/2009 | Radke et al. |
| 2009/0204831 A1* | 8/2009 | Cousson et al. ............... 713/322 |

* cited by examiner

STATE CHANGE IN SYSTEMS HAVING DEVICES COUPLED IN A CHAINED CONFIGURATION

TECHNICAL FIELD

The present disclosure relates generally to semiconductor memory devices, methods, and systems, and more particularly, to state change in systems having devices coupled in a chained configuration.

BACKGROUND

Memory devices are typically provided as internal, semiconductor, integrated circuits and/or external removable devices in computers, personal digital assistants (PDAs), digital cameras, and cellular telephones, among various other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Various types of memory can be used in memory systems. The various types of memory can be used in various combinations to provide memory for a host. For example, flash memory can be included in a memory system. Flash memory can be part of a memory system as internal memory or as removable memory that can be coupled to the memory system through an interface, such as a USB connection, for example.

A memory system can include a host, such as a computer, and an external memory device having a direct connection to the host. During operation of the memory system, the external memory device can receive information from the host and/or send information to the host. The amount of power used by an external memory device during operation of the memory system can depend on the communication rate of the device, e.g., the speed at which the device receives information from the host and/or sends information to the host. For example, a device with a high communication rate may use more power than a device with a low communication rate.

DETAILED DESCRIPTION

Figure 1:
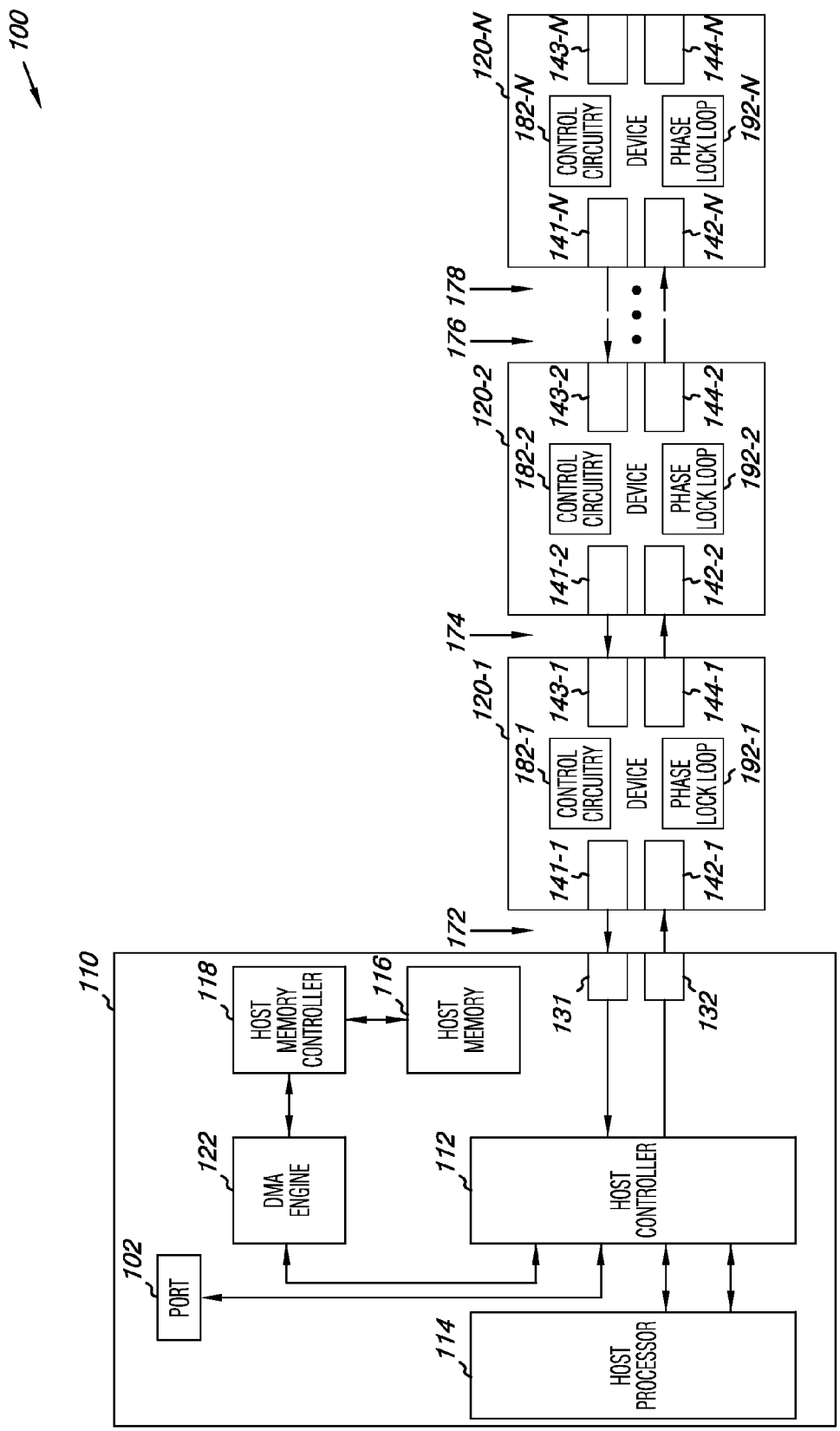
FIG. 1 illustrates a block diagram of a system in accordance with a number of embodiments of the present disclosure.

The present disclosure includes methods, devices, and systems for state change in systems having devices coupled in a chained configuration. A number of embodiments include a host and a number of devices coupled to the host in a chained configuration. The chained configuration includes at least one device that is not directly coupled to the host. The at least one device that is not directly coupled to the host is configured to change from a first communication state to a second communication state responsive to receipt of a command from the host.

Embodiments of the present disclosure can be used to manage power consumption, e.g., the amount of power used, by a number of devices coupled to a host in a chained configuration. The amount of power used by a device coupled to a host in a chained configuration can depend on, for example, the communication rate of the device, e.g., the speed at which the device communicates information. Communicating information can include, for example, sending and/or receiving information.

For example, a device in the chain that communicates, e.g., sends and/or receives, information at a high rate may use more power than a device in the chain that communicates information at a low rate. Accordingly, the amount of power used by a device in the chain can be managed by changing the communication rate of the device. For example, changing a device in the chain from a state in which the device communicates information at a low rate to a state in which the device communicates information at a high rate can increase the amount of power used by the device.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designator "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 illustrates a block diagram of a system 100 in accordance with a number of embodiments of the present disclosure. System 100 can be, for example, a memory system. As shown in FIG. 1, system 100 includes host 110 and devices 120-1, 120-2, . . . , 120-N. Devices 120-1, 120-2, . . . , 120-N can be memory or non-memory devices. For example, devices 120-1, 120-2, . . . , 120-N can be dynamic random access memory (DRAM) or flash memory devices (e.g., NOR and/or NAND flash memory device), printers, scanners, cameras, or wireless communication devices (e.g., a Bluetooth or WiFi device), among various other memory and non-memory devices. Additionally, devices 120-1, 120-2, . . . , 120-N can be removable and/or peripheral devices. For example, devices 120-1, 120-2, ..., 120-N can be digital cameras, MP3 players, network devices, and/or USB devices, among other removable and/or peripheral devices.

As shown in FIG. 1, host 110 includes port 102, host controller 112, host processor 114, host memory 116, host memory controller 118, direct memory access (DMA) engine 122, host input port 131, and host output port 132. One of skill in the art will appreciate that host processor 114 can include a number of processors, such as a parallel processing system, a number of coprocessors, etc. Host 110 can also include additional elements, e.g., additional computing device elements, not shown in FIG. 1, as will be understood by one of skill in the art.

Host 110 can be, for example, a computing device, such as a personal computer, among other computing device types. Examples of host 110 include laptop computers, personal computers, mobile phones, digital cameras, digital recording and play back devices, PDA's, memory card readers, and interface hubs, among other examples.

As shown in FIG. 1, host controller 112 is coupled to port 102 and host processor 114. Host controller 112 is also coupled to host memory 116 via DMA engine 122 and host memory controller 118. Although host memory 116 is shown as being located within host 110, embodiments of the present disclosure are not so limited. For example, host memory 116 can be separate from, e.g., located outside of host 110, and/or can be located within devices 120-1, 120-2, ..., 120-N. In both of the examples above, host memory 116 can be considered "associated with" host 110.

Port 102 can be a hardware port. A hardware port can be used to couple a hardware device to host 110. For example, a hardware port can be used to couple a removable and/or peripheral hardware device, such as a digital camera, an MP3 player, a network device, and/or USB device, among other devices, to host 110. A hardware port can also be used to couple a media codec to host 110 for play-back of audio and/or video. The coupling of a hardware device to host 110 via port 102 can allow the hardware device to communicate with devices 120-1, 120-2, ..., 120-N, host memory 116, and/or other memory in host 110. For example, data can be read, written, and/or erased to and/or from the hardware device, devices 120-1, 120-2, ..., 120-N, and/or host memory 116.

As shown in FIG. 1, devices 120-1, 120-2, ..., 120-N are coupled to host 110, e.g., host controller 112, in a chained configuration. Devices coupled to a host, e.g., host 110, in a chained configuration can be communicatively coupled to the host via the same interface port of the host. A particular host interface port can include an input port, e.g., host input port 131, and an output port, e.g., host output port 132. As such, information, e.g., control, address, data, instructions, commands, and other signals, can be communicated between host 110 and devices 120-1, 120-2, ..., 120-N via the same interface port of host 110, e.g., via host input port 131 and host output port 132.

The chained configuration shown in FIG. 1 includes a first device, e.g., device 120-1, directly coupled to host 110, a second device, e.g., device 120-2, directly coupled to the first device, a third device (not shown) directly coupled to the second device, ..., and an Nth device, e.g., device 120-N, directly coupled to an N–1th device (not shown). The device directly coupled to host 110, e.g., device 120-1, can be referred to as the first device in the chain, and the device furthest downstream in the chain, e.g., device 120-N, can be referred to as the last device in the chain.

A chained configuration of devices, such as the chained configuration shown in FIG. 1, can allow for point to point signaling, and can be arbitrarily long without the need for complex addressing circuitry. In a number of embodiments, devices 120-1, 120-2, ..., 120-N can be coupled to a bus (not shown), and the last device in the chain, e.g., device 120-N, can be removed from the chain.

When an element is referred to as being "directly coupled" to another element, there are no intervening elements present between the two elements. In contrast, when an element is referred to as being "coupled" to another element, a number of intervening elements may be present between the two elements. For example, with reference to FIG. 1, device 120-2 can be considered to be coupled to host 110 via device 120-1. However, device 120-2 is not directly coupled to host 110, because device 120-1 is an intervening element present between device 120-2 and host 110. In contrast, device 120-1 is directly coupled to host 110, because no intervening elements are present between device 120-1 and host 110.

Host controller 112 can be used to communicate information, e.g., control, address, data, instructions, commands, and other signals, between host 110 and devices 120-1, 120-2, ..., 120-N. For example, host controller can be coupled to implement a standardized interface for passing information between host 110, e.g., host processor 114, and devices 120-1, 120-2, ..., 120-N. The standardized interface can include host input port 131 and host output port 132. Additionally, when devices 120-1, 120-2, ..., 120-N are used for data storage for system 100, host controller 112 can implement a serial advanced technology attachment (SATA), a peripheral component interconnect express (PCIe), a universal serial bus (USB), and/or a small computer system interface (SCSI), among other interfaces. Such interfaces can also include host input port 131 and host output port 132.

As shown in FIG. 1, information can be communicated between host 110 and devices 120-1, 120-2, ..., 120-N in both a downstream and an upstream manner, e.g., direction. During a downstream communication, information is communicated away from host 110, e.g., from host 110 to devices 120-1, 120-2, ..., 120-N, and during an upstream communication information is communicated toward host 110, e.g., from devices 120-1, 120-2, ..., 120-N to host 110.

For example, during a downstream communication, host controller 112 can send information from host 110 to the first device in the chain, e.g., device 120-1. Device 120-1 can then send the information to the next downstream device in the chain, e.g., device 120-2. Device 120-2 can then send the information to the next downstream device in the chain (not shown), and the information can continue to be sent downstream in the chain until it reaches the last device in the chain, e.g., device 120-N. However, in a number of embodiments, information may not be sent to all the devices in the chain during a downstream communication, e.g., a device in the chain may receive information from an upstream device, but may not send the information further downstream. For example, device 120-2 may receive information from device 120-1, but may not send the information further downstream to devices that are downstream from device 120-2.

During an upstream communication, for example, the last device in the chain, e.g., device 120-N, can send information to the next upstream device in the chain (not shown), and the information can continue to be sent upstream in the chain until it reaches host 110. However, embodiments of the present disclosure are not so limited, and an upstream communication can begin at any device in the chain, e.g., not all devices in the chain may be involved in an upstream communication. For example, in an upstream communication which begins at device 120-2, device 120-2 can send information to device 120-1, and device 120-1 can then send the information to host 110. In such embodiments, devices located downstream from the device that initiates the upstream communication will not be involved in the upstream communication, e.g., will not receive the information included in the upstream communication.

As shown in FIG. 1, device 120-1 includes upstream output port 141-1, upstream input port 142-1, downstream input port 143-1, and downstream output port 144-1. Device 120-2 includes upstream output port 141-2, upstream input port 142-2, downstream input port 143-2, and downstream output port 144-2. Device 120-N includes upstream output port 141-N, upstream input port 142-N, downstream input port 143-N, and downstream output port 144-N. Each device 120-1, 120-2, . . . , 120-N can use its respective upstream and downstream input and output port during downstream and upstream communication.

For example, during a downstream communication, device 120-1 can receive information from host 110, e.g., from host output port 132, through upstream input port 142-1, and can send the information to device 120-2 through downstream output port 144-1. Device 120-2 can receive the information from device 120-1 through upstream input port 142-2, and can send the information to the next downstream device in the chain (not shown) through downstream output port 144-2. Device 120-N can receive the information from the N−1th device in the chain (not shown) through upstream input port 142-N.

During an upstream communication, for example, device 120-N can send information to the next upstream device in the chain, e.g., the N−1th device, (not shown) through upstream output port 141-N. Device 120-2 can receive the information through downstream input port 143-2, and can send the information to device 120-1 through upstream output port 141-2. Device 120-1 can receive the information from device 120-2 through downstream input port 143-1, and can send the information to host 110, e.g., host input port 131, through upstream output port 141-1.

As shown in FIG. 1, system 100 includes links 172, 174, 176, and 178. Link 172 can directly couple device 120-1 to host 110, link 174 can directly couple device 120-2 to device 120-1, link 176 can directly couple device 120-2 to the next device in the chain (not shown), and link 178 can directly couple device 120-N to the N−1 th device in the chain (not shown). Link 172 can include host input port 131, host output port 132, upstream output port 141-1, and upstream input port 142-1. Link 174 can include downstream input port 143-1, downstream output port 144-1, upstream output port 141-2, and upstream input port 142-2. Link 176 can include downstream input port 143-2, downstream output port 144-2, and the upstream output port and the upstream input port of the next device in the chain (not shown). Link 178 can include upstream output port 141-N, upstream input port 142-N, and the downstream input port and the downstream output port of the N−1th device in the chain (not shown).

A link, e.g., the input and output ports in a link, can be in one of a number of states. Additionally, a device can be in one of a number of states. For example, a link can be in a high speed state, a low speed state, a sleep state, or an off state, among other states. A device can be in a high speed state, a low speed state, a step down state, or a sleep state, among other states.

A link and/or device in a high speed state can be capable of or presently communicating, e.g., the input and/or output ports in the link and/or device, can be capable of or presently receiving and/or sending, information, e.g., data, at a rate that is approximately 10 to 100 times faster than a rate at which a link in a low speed state is capable of or presently communicating information. For example, a link and/or device in a high speed state can be capable of or presently communicating information at approximately 2.5 gigabytes per second, while a link in a low speed state can be capable of or presently communicating information at approximately 250 megabytes per second to approximately 25 megabytes per second. However, embodiments are not limited to this specific example.

A link in a sleep state may not be active, but may be monitored. A link in an off state may be disabled. A device in a step down state is a device whose upstream link is faster than its downstream link, e.g., a device whose upstream input and output ports are faster than its downstream input and output ports. For example, a device in a step down state can be capable of or presently receiving information from an upstream device at a high speed and capable of or presently sending information to a downstream device at a low speed. A device in a sleep state may not be active, but may be monitoring a number of input and/or output ports associated with the device.

A link in a high speed state can be in a high speed communication state or a high speed standby state. A link in a high speed communication state may be presently communicating information at a high speed, e.g., an input port and/or output port in the link may be presently receiving and/or sending information at a high speed. A link in a high speed standby state may not be presently communicating any information, but can be capable of communicating information at a high speed.

A link in a low speed state can be in a low speed communication state or a low speed standby state. A link in a low speed communication state may be presently communicating information at a low speed, e.g., an input port and/or output port in the link may be presently receiving and/or sending information at a low speed. A link in a low speed standby state may not be presently communicating any information, but can be capable of communicating information at a low speed.

A device in a high speed state can be in a high speed bypass state, a high speed stop state, or a high speed last state. A device in a high speed bypass state can have an upstream input port and/or a downstream input port in a high speed communication state or a high speed standby state, and a downstream output port and/or an upstream output port in a high speed communication state or a high speed standby state. A device in a high speed stop state can have an upstream input port and/or an upstream output port in a high speed communication state or a high speed standby state, and a downstream output port and/or a downstream input port in a sleep state. A device in a high speed last state can have an upstream input port and/or an upstream output port in a high speed communication state or a high speed standby state, and a downstream output port and/or a downstream input port in an off state.

A device in a low speed state can be in a low speed bypass state, a low speed stop state, or a low speed last state. A device in a low speed bypass state can have an upstream input port and/or a downstream input port in a low speed communication state or a low speed standby state, and a downstream output port and or an upstream output port in a low speed communication state or a low speed standby state. A device in a low speed stop state can have an upstream input port and/or an upstream output port in a low speed communication state or a low speed standby state, and a downstream output port and/or a downstream input port in a sleep state. A device in a low speed last state can have an upstream input port and/or an upstream output port in a low speed communication state or a low speed standby state, and a downstream output port and/or a downstream input port in an off state.

The state of an output port in a link may match the state of its corresponding input port in the link, and vice versa. For example, if host output port 132 in link 172 is in a high speed state, upstream input port 142-1 in link 172 may also be in a high speed state. Additionally, the state of a first output port in a link and its corresponding first input port in the link may match the state of a second output port in the link and its corresponding second input port in the link. For example, if host output port 132 and upstream input port 142-1 in link 172 are in a high speed state, upstream output port 141-1 and host input port 131 in link 172 may also be in a high speed state. Accordingly, the states of all four ports in a link may match.

The speed associated with the state of a link and/or device may be as fast as or faster than the speed associated with the state of any downstream link and/or device. For example, if link 172 is in a high speed state, links 174, 176, and 178 may be in a high speed state, a low speed state, a sleep state, or an off state. If link 172 is in a low speed state, links 174, 178, and 178 may be in a low speed state, a sleep state, or an off state. Similarly, if device 120-1 is in a high speed state, devices 120-2, ..., 120-N may be in a high speed state, a low speed state, a step down state, or a sleep state. If device 120-1 is in a low speed state, devices 120-2, ..., 120-N may by in a low speed state or a sleep state.

As shown in FIG. 1, device 120-1 includes phase lock loop 192-1, device 120-2 includes phase lock loop 192-2, and device 120-N includes phase lock loop 192-3. Phase lock loop 192-1 can be associated with link 172 and/or link 174, phase lock loop 192-2 can be associated with link 174 and/or 176, and phase lock loop 192-3 can be associated with link 178. However, embodiments of the present disclosure are not so limited, and devices 120-1, 120-2, ..., 120-N can include multiple phase lock loops, wherein each phase lock loop in a device can be associated with a particular link and/or a particular port. For example, device 120-1 can include a first phase lock loop and a second phase lock loop, wherein the first phase lock loop may be associated with link 172 and the second phase lock loop may be associated with link 174. However, embodiments are not limited to this example.

If a link and/or device is in a high speed state, the phase lock loop associated with the link and/or device may be on, and if a link and/or device is in a low speed state, the phase lock loop associated with the link and/or device may be off. For example, if link 172 is in a high speed state, phase lock loop 192-1 may be on, and if link 172 is in a low speed state, phase lock loop 192-1 may be off. If device 120-1 is in a high speed state, phase lock loop 192-1 may be on, and if device 120-1 is in a low speed state, phase lock loop 192-1 may be off.

The amount of power used by a link and/or device can depend on, for example, the state of the link and/or device, e.g., the speed at which the link and/or device communicates information. For example, a link and/or device in a high speed state may use more power than a link and/or device in a low speed state. Accordingly, the amount of power used by a link and/or device can be managed by changing the link and/or device from a first state to a second state. For example, changing a link and/or device from a low speed state to a high speed state can increase the amount of power used by the link.

Host 110, e.g., host processor 114, can send a number of commands to devices 120-1, 120-2, ..., 120-N through host controller 112 and host output port 132. The number of commands can include one or more commands to change a number of links 172, 174, 176, and 178 and/or a number of devices 120-1, 120-2, ..., 120-N from a first state to a second state. For example, host 110 can send a command to device 120-N to change link 178, e.g., upstream output port 141-N and upstream input port 142-N, from a low speed state to a high speed state. Additionally, host 110 can send a command to device 120-N to change from a low speed state to a high speed state. However, embodiments of the present disclosure are not so limited, and the number of commands can include one or more commands to change a number of the links and/or devices from a number of the states described herein to a number of the states described herein, as will be further described herein.

As shown in FIG. 1, device 120-1 includes control circuitry 182-1, device 120-2 includes control circuitry 182-2, and device 120-N includes control circuitry 182-N. Control circuitries 182-1, 182-2, and 182-N can be configured to change devices 120-1, 120-2, ..., 120-N and/or the link(s) associated with devices 120-1, 120-2, and 120-N, respectively, from a first state to a second state responsive to receipt by the devices of a number of commands to change a number of the links and/or devices from a first state to a second state. For example, control circuitry 182-N can be configured to change link 178, e.g., upstream output port 141-N and upstream input port 142-N, from a low speed state to a high speed state responsive to receipt by device 120-N of a command to change link 178 from a low speed state to a high speed state. Additionally, control circuitry 182-N can be configured to change device 120-N from a low speed state to a high speed state responsive to receipt by device 120-N of a command to change device 120-N from a low speed state to a high speed state. However, embodiments of the present disclosure are not so limited, and the control circuitries can be configured to change the links and/or devices from a number of the states described herein to a number of the states described herein responsive to receipt by the devices of a number of commands, as will be further described herein.

In a number of embodiments, control circuitries 182-1, 182-2, and 182-N can be configured to send an acknowledgement of a command to host 110 responsive to changing a link(s) and/or device from a first state to a second state in accordance with a command received from host 110. Host 110 can then send an additional command to change a number of the links and/or devices from the second state to a third state responsive to receipt of the acknowledgement. In such embodiments, the response time associated with the first command, e.g., the amount time associated with changing the link(s) and/or device from the first state to the second state, can be a variable response time. The response time can vary according to, for example, the speed(s) and/or type of state(s) associated with the first and second states, and/or the location of the link(s) and/or device in the chained configuration, among other factors. The response time can be, for example, on the order of a hundred microseconds.

In a number of embodiments, host 110 may be aware of an amount of time associated with changing a particular link and/or a particular device from a first state to a second state. For example, host memory 116 can include information associated with the amount of time associated with changing a particular link and/or a particular device from a first state to a second state. The amount of time can vary according to, for example, the speed(s) and/or type of state(s) associated with the first and second states, and/or the location of the particular link and/or particular device in the chained configuration, among other factors. In such embodiments, host 110 may send an additional command to change a number of the links and/or devices from the second state to a third state responsive to an expiration of the amount of time. That is, in such embodiments, host 110 may send an additional command to change a number of the links and/or devices from the second state to the third state without waiting for an acknowledgement of a command to change the link and/or device from the first state to the second state.

In a number of embodiments in which devices 120-1, 120-2, ..., 120-N are memory devices, control circuitries 182-1, 182-2, and 182-N can be used to facilitate operations, such as read, write, and/or erase commands, among other operations, that are communicated to devices 120-1, 120-2, ..., 120-N from host 110. Control circuitries 182-1, 182-2, and 182-N can also provide a translation layer between host 110 and devices 120-1, 120-2, ..., 120-N. Thus, control circuitries 182-1, 182-2, and 182-N could selectively couple an I/O connector (not shown) of devices 120-1, 120-2, ..., 120-N to receive the appropriate signal at the appropriate I/O connection at the appropriate time. Similarly, the communication protocol between host 110 and devices 120-1, 120-2, ..., 120-N may be different than what is required for access to devices 120-1, 120-2, ..., 120-N. Control circuitries 182-1, 182-2, and 182-N could then translate the command sequence received from host 110 into appropriate command sequences to achieve the desired access to devices 120-1, 120-2, ..., 120-3. Each translation may further include changes in signal voltage levels in addition to command sequences.

The embodiment illustrated in FIG. 1 can include additional circuitry that is not illustrated so as not to obscure embodiments of the present disclosure. For example, devices 120-1, 120-2, ..., 120-N can include address circuitry to latch address signals provided over I/O connectors through I/O circuitry. Address signals can be received and decoded by a row decoder and a column decoder, to access devices 120-1, 120-2, ..., 120-N. It will be appreciated by those skilled in the art that the number of address input connectors can depend on the density and architecture of devices 120-1, 120-2, ..., 120-N.

Figure 2A:
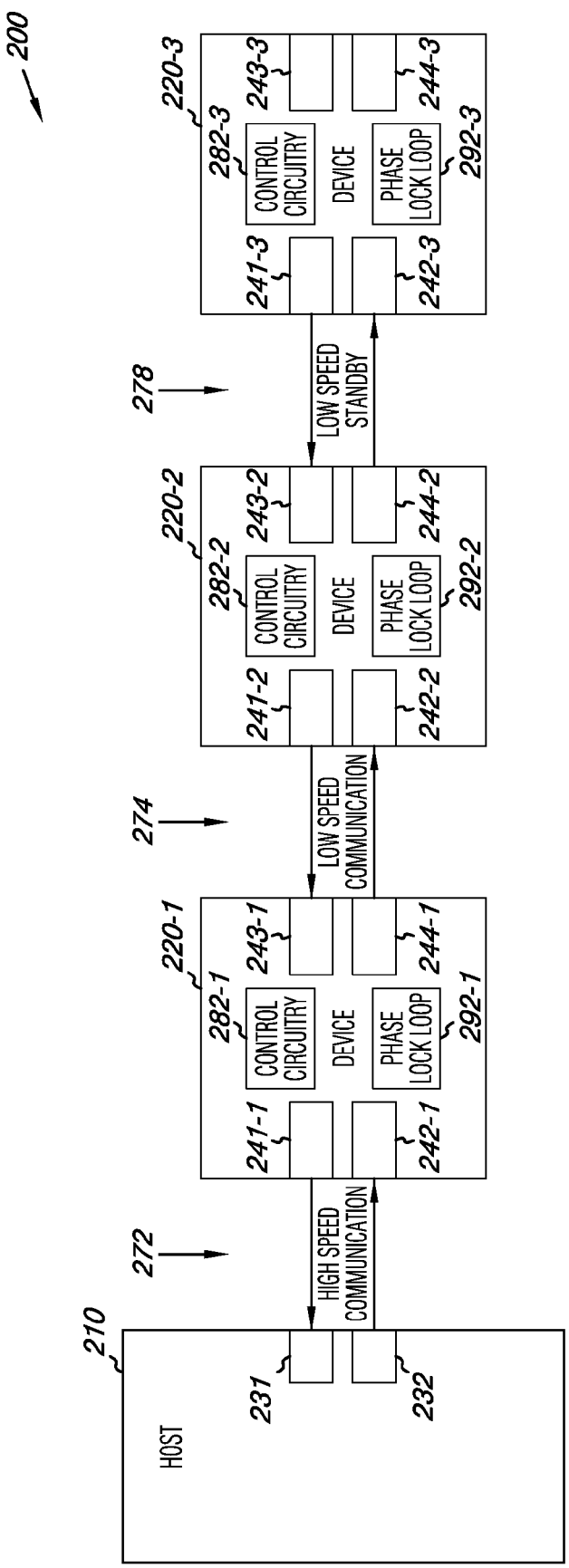
FIGS. 2A-2C illustrate a block diagram of a system in accordance with a number of embodiments of the present disclosure.
Figure 2B:
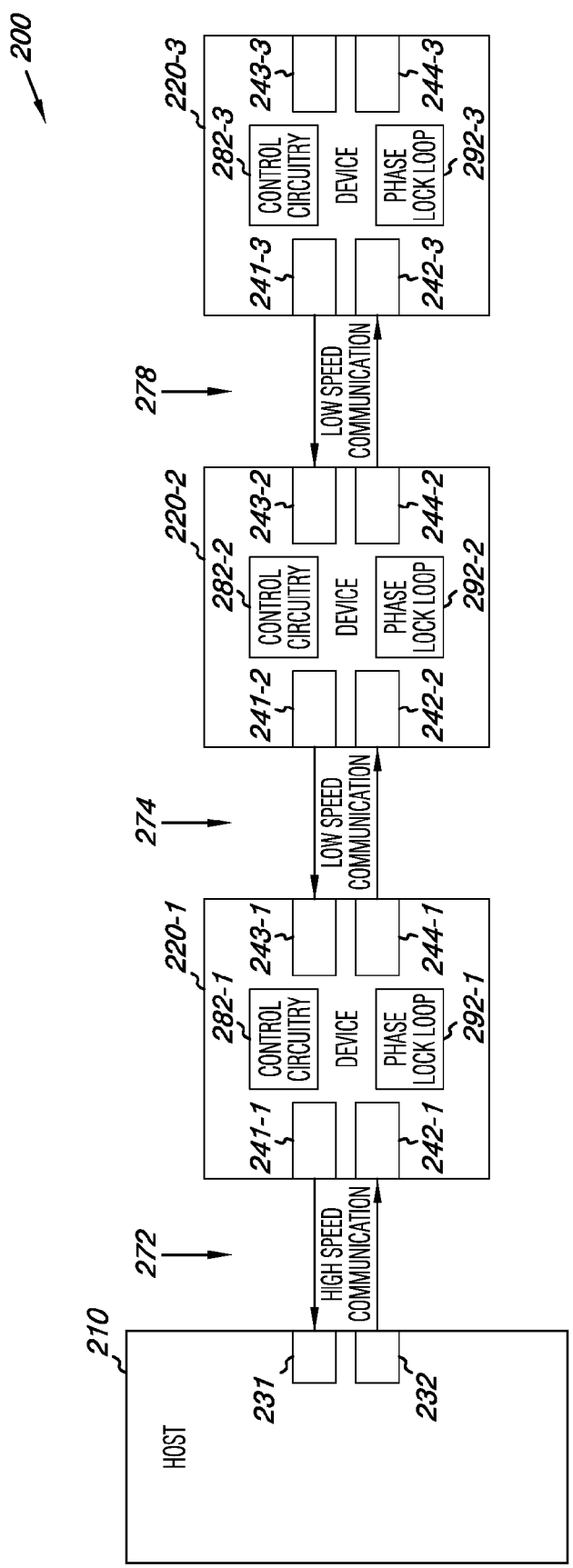
Figure 2C:
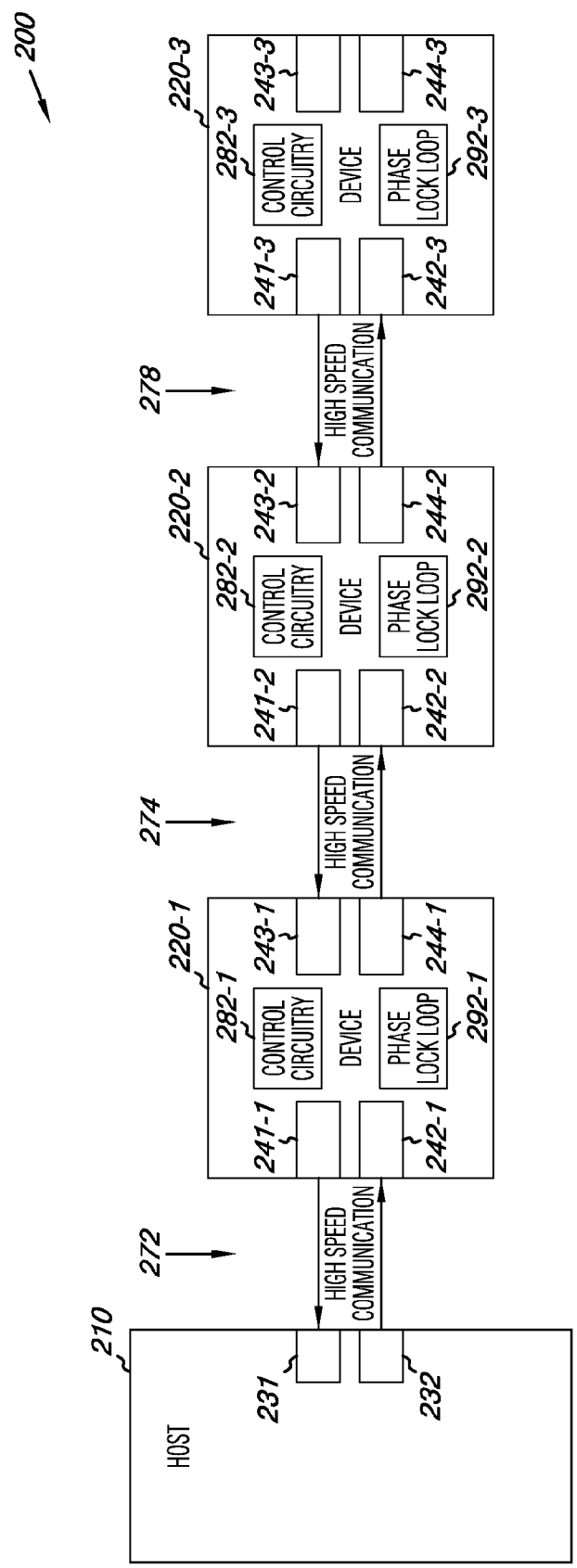

FIGS. 2A-2C illustrate a block diagram of a system 200 in accordance with a number of embodiments of the present disclosure. System 200 can be, for example, a memory system. As shown in FIGS. 2A-2C, system 200 includes host 210 and devices 220-1, 220-2, and 220-3. Devices 220-1, 220-2, and 220-3 can be, for example, memory devices, non-memory devices, removable devices, and/or peripheral devices, among other types of devices. Host 210 can be analogous to host 110 shown in FIG. 1, and can include elements analogous to the elements included in host 110. For example, as shown in FIGS. 2A-2C, host 210 includes host input port 231 and host output port 232.

As shown in FIGS. 2A-2C, devices 220-1, 220-2, and 220-3 are coupled to host 210, e.g., host input port 231 and host output port 232, in a chained configuration. The chained configuration includes a first device, e.g., device 220-1, directly coupled to host 210, a second device, e.g., device 220-2, directly coupled to the first device, and a third device, e.g., device 220-3, directly coupled to the second device.

Information, e.g., control, address, data, instructions, commands, and other signals, can be communicated between host 210 and devices 220-1, 220-2, and 220-3 in a manner analogous to that previously described in connection with FIG. 1. For example, information can be communicated between host 210 and memory devices 220-1, 220-2, and 220-3 in both a downstream and an upstream manner analogous to that previously described in connection with FIG. 1.

As shown in FIGS. 2A-2C, device 220-1 includes upstream output port 241-1, upstream input port 242-1, downstream input port 243-1, and downstream output port 244-1. Device 220-2 includes upstream output port 241-2, upstream input port 242-2, downstream input port 243-2, and downstream output port 244-2. Device 220-3 includes upstream output port 241-3, upstream input port 242-3, downstream input port 243-3, and downstream output port 244-3. Downstream input port 243-3 and downstream output port 244-3 may be in an off state, e.g., disabled, as no device is coupled to downstream input port 243-3 and downstream output port 244-3. Each device can use its respective upstream and downstream input and output port during downstream and upstream communication in a manner analogous to that previously described in connection with FIG. 1.

As shown in FIGS. 2A-2C, device 220-1 includes control circuitry 282-1 and phase lock loop 292-1, device 220-2 includes control circuitry 282-2 and phase lock loop 292-2, and device 220-3 includes control circuitry 282-3 and phase lock loop 292-3. The control circuitries and phase lock loops shown in FIGS. 2A-2C can be analogous to the control circuitries and phase lock loops previously described in connection with FIG. 1.

As shown in FIGS. 2A-2C, system 200 includes links 272, 274, and 278. Link 272 can include host input port 231, host output port 232, upstream output port 241-1, and upstream input port 242-1, and can directly couple device 220-1 to host 210. Link 274 can include downstream input port 243-1, downstream output port 244-1, upstream output port 241-2, and upstream input port 242-2, and can directly couple device 220-2 to device 220-1. Link 278 can include downstream input port 243-2, downstream output port 244-2, upstream output port 241-3, and upstream input port 242-3.

In the embodiment illustrated in FIG. 2A, link 272 is in a high speed communication state, link 274 is in a low speed communication state, and link 278 is in a low speed standby state. Such a configuration may reduce the amount of power used by system 200, because two of the three links are in a low speed state. However, it may be desirable to increase the speed at which system 200 operates, e.g., to increase the speed at which information is communicated in system 200.

Host 210 can send a first command to devices 220-2 and 220-3, e.g., host 210 can send the first command to device 220-1, which can send the first command to device 220-2, which can send the first command to device 220-3. The first command can include a command to change link 278, e.g., downstream input port 243-2, downstream output port 244-2, upstream output port 241-3, and upstream input port 242-3, from the low speed standby state to the low speed communication state. Responsive to receipt of the first command by device 220-2, control circuitry 282-2 can change downstream input port 243-2 and downstream output port 244-2 from the low speed standby state to the low speed communication state. Responsive to receipt of the first command by device 220-3, control circuitry 282-3 can change upstream output port 241-3 and upstream input port 242-3 from the low speed standby state to the low speed communication state. That is, responsive to the first command, link 278 can change from the low speed standby state to the low speed communication state, as shown in the embodiment illustrated in FIG. 2B.

Control circuitry 282-3 can send an acknowledgement of the first command to host 210 responsive to changing link 278 from the low speed standby state to the low speed communication state. Host 210 can then send a second command to devices 220-1, 220-2, and 220-3, e.g., host 210 can send the second command to device 220-1, which can send the second command to device 220-2, which can send the second command to device 220-3, responsive to receipt of the acknowledgement or after an appropriate interval. The second command can include a command to change links 274 and 278 from the low speed communication state to the high speed communication state.

Host 210 may be aware of an amount of time associated with changing link 278 from the low speed standby state to the low speed communication state. For example, host 210 can include a host memory (not shown), which can include information associated with the amount of time associated with changing link 278 from the low speed standby state to the low speed communication state. Host 210 can send the second command to devices 220-1, 220-2, and 220-3, responsive to an expiration of the amount of time.

Responsive to receipt of the second command by device 220-1, control circuitry 282-1 can change downstream input port 243-1 and downstream output port 244-1 from the low speed communication state to the high speed communication state. Responsive to receipt of the second command by device 220-2, control circuitry 282-2 can change upstream output port 241-2, upstream input port 242-2, downstream input port 243-2, and downstream output port 244-2 from the low speed communication state to the high speed communication state. Responsive to receipt of the second command by device 220-3, control circuitry 282-3 can change upstream output port 241-3 and upstream input port 242-3 from the low speed communication state to the high speed communication state. That is, responsive to the second command, links 274 and 278 can change from the low speed communication state to the high speed communication state, as shown in the embodiment illustrated in FIG. 2C. Control circuitry 282-3 can then send an acknowledgement of the second command to host 210 responsive to changing link 278 from the low speed communication state to the high speed communication state.

By changing the states of links 274 and 278 in such a manner, e.g., changing link 278 from the low speed standby state to the low speed communication state and then changing links 274 and 278 from the low speed communication state to the high speed communication state, the speed associated with the state of each link 272, 274, and 278 may remain as fast as or faster than the speed associated with the state of any downstream link throughout the process. For example, the speed associated with the state of link 274 may remain as fast as or faster than the speed associated with the state of link 278 throughout the process. In contrast, if, for example, link 278 were to change directly from the low speed standby state to the high speed communication state, the speed associated with the state of link 274 would be slower than the speed associated with the state of link 278, e.g., link 274 would be in a low speed state while link 278 would be in a high speed state.

In a number of embodiments in which devices 220-1, 220-2, and 220-3 are memory devices, control circuitries 282-1, 282-2, and 283-1 can be used to facilitate operations, such as read, write, and/or erase commands, among other operations, that are communicated to devices 220-1, 220-2, and 220-3 from host 210, as previously described in connection with FIG. 1. Additionally, the embodiments illustrated in FIGS. 2A-2C can include additional circuitry that is not illustrated so as not to obscure embodiments of the present disclosure, as previously described in connection with FIG. 1.

FIGS. 3A-3F illustrate a block diagram of a system 300 in accordance with a number of embodiments of the present disclosure. System 300 can be, for example, a memory system. As shown in FIGS. 3A-3F, system 300 includes host 310 and devices 320-1, 320-2, and 320-3. Devices 320-1, 320-2, and 320-3 can be memory devices, non-memory devices, removable devices, and/or peripheral devices, among other types of devices. Host 310 can be analogous to host 110 shown in FIG. 1, and can include elements analogous to the elements included in host 110. For example, as shown in FIGS. 3A-3F, host 310 includes host input port 331 and host output port 332.

As shown in FIGS. 3A-3F, devices 320-1, 320-2, and 320-3 are coupled to host 310, e.g., host input port 331 and host output port 332, in a chained configuration analogous to that previously described in connection with FIG. 2. Information, e.g., control, address, data, instructions, commands, and other signals, can be communicated between host 310 and devices 320-1, 320-2, and 320-3 in a manner, e.g., in both a downstream and upstream manner, analogous to that previously described in connection with FIG. 1.

As shown in FIGS. 3A-3F, device 320-1 includes upstream output port 341-1, upstream input port 342-1, downstream input port 343-1, and downstream output port 344-1. Device 320-2 includes upstream output port 341-2, upstream input port 342-2, downstream input port 343-2, and downstream output port 344-2. Device 320-3 includes upstream output port 341-3, upstream input port 342-3, downstream input port 344-3, and downstream output port 344-3. Downstream input port 343-3 and downstream output port 344-3 can be in an off state. Each device can use its respective upstream and downstream input and output port during downstream and upstream communication in a manner analogous to that previously described in connection with FIG. 1.

As shown in FIGS. 3A-3F, device 320-1 includes control circuitry 382-1 and phase lock loop 392-1, device 320-2 includes control circuitry 382-2 and phase lock loop 392-2, and device 320-3 includes control circuitry 382-3 and phase lock loop 392-3. The control circuitries and phase lock loops shown in FIGS. 3A-3F can be analogous to the control circuitries and phase lock loops previously described in connection with FIG. 1.

As shown in FIGS. 3A-3F, system 300 includes links 372, 374, and 378. Link 372 can include host input port 331, host output port 332, upstream output port 341-1, and upstream input port 342-1, and can directly couple device 320-1 to host 310. Link 374 can include downstream input port 343-1, downstream output port 344-1, upstream output port 341-2, and upstream input port 342-2, and can directly couple device 320-2 to device 320-1. Link 378 can include downstream input port 343-2, downstream output port 344-2, upstream output port 341-3, and upstream input port 342-3.

Figure 3A:
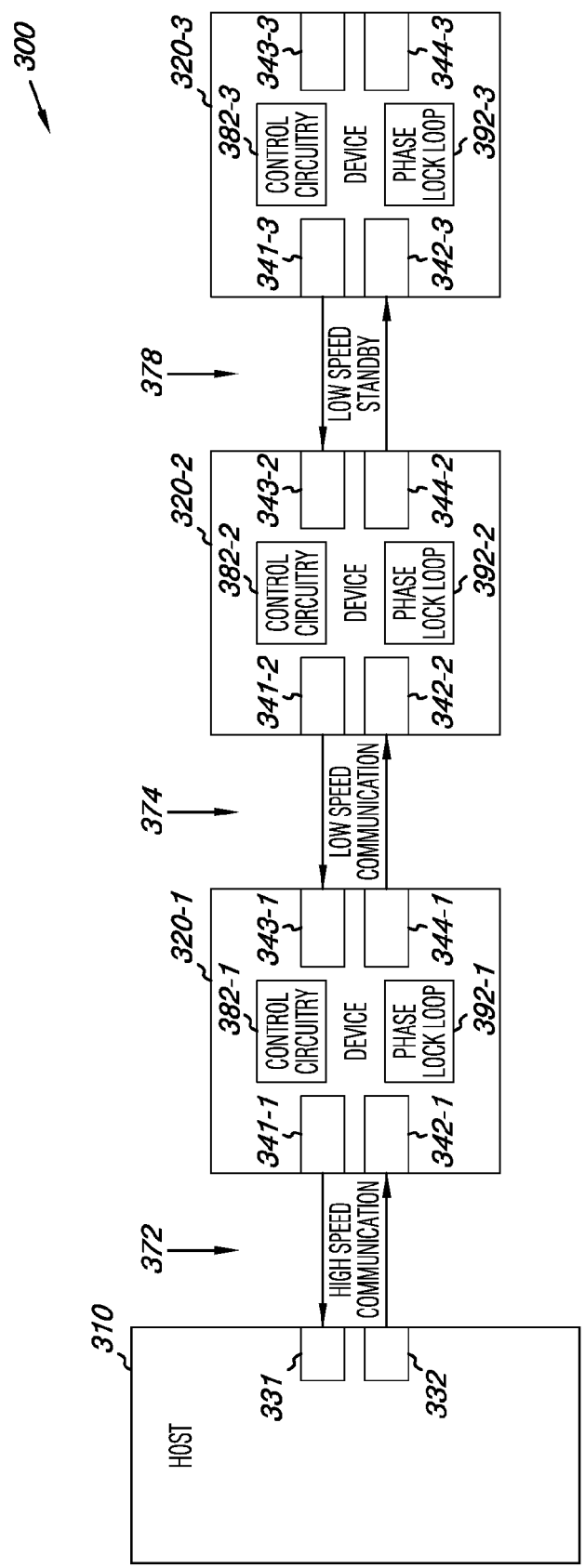
FIGS. 3A-3F illustrate a block diagram of a system in accordance with a number of embodiments of the present disclosure.
Figure 3B:
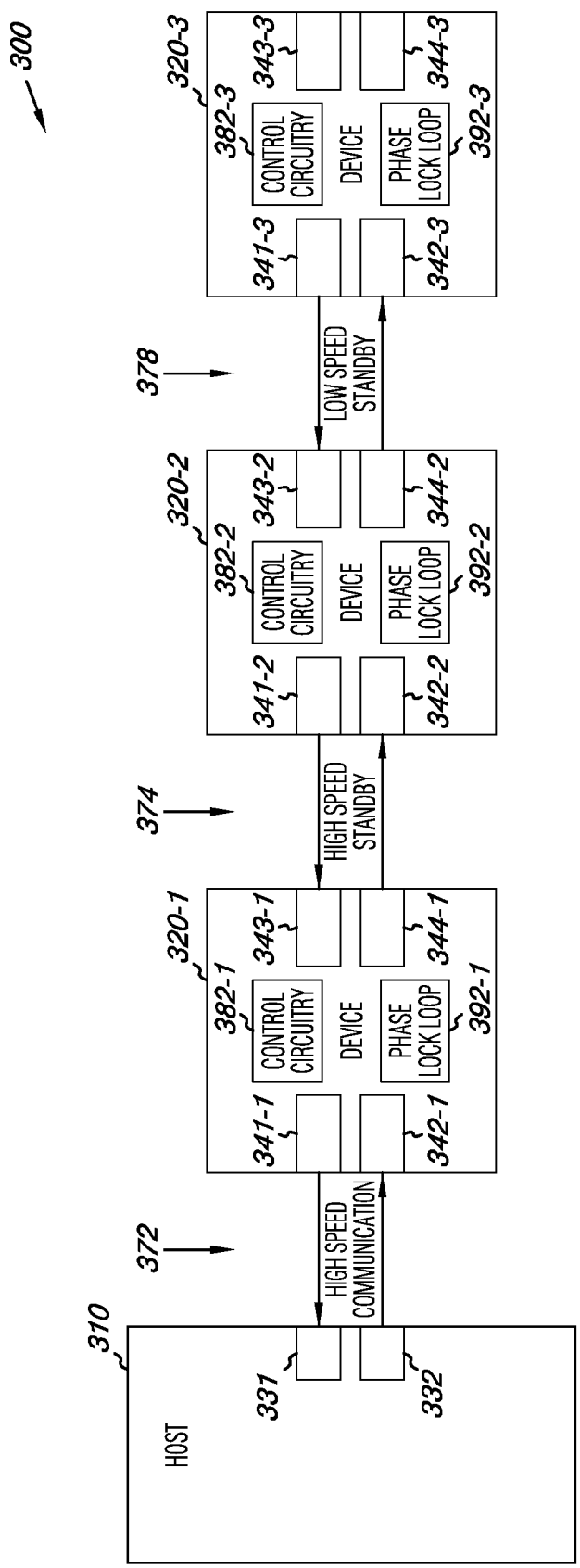
Figure 3C:
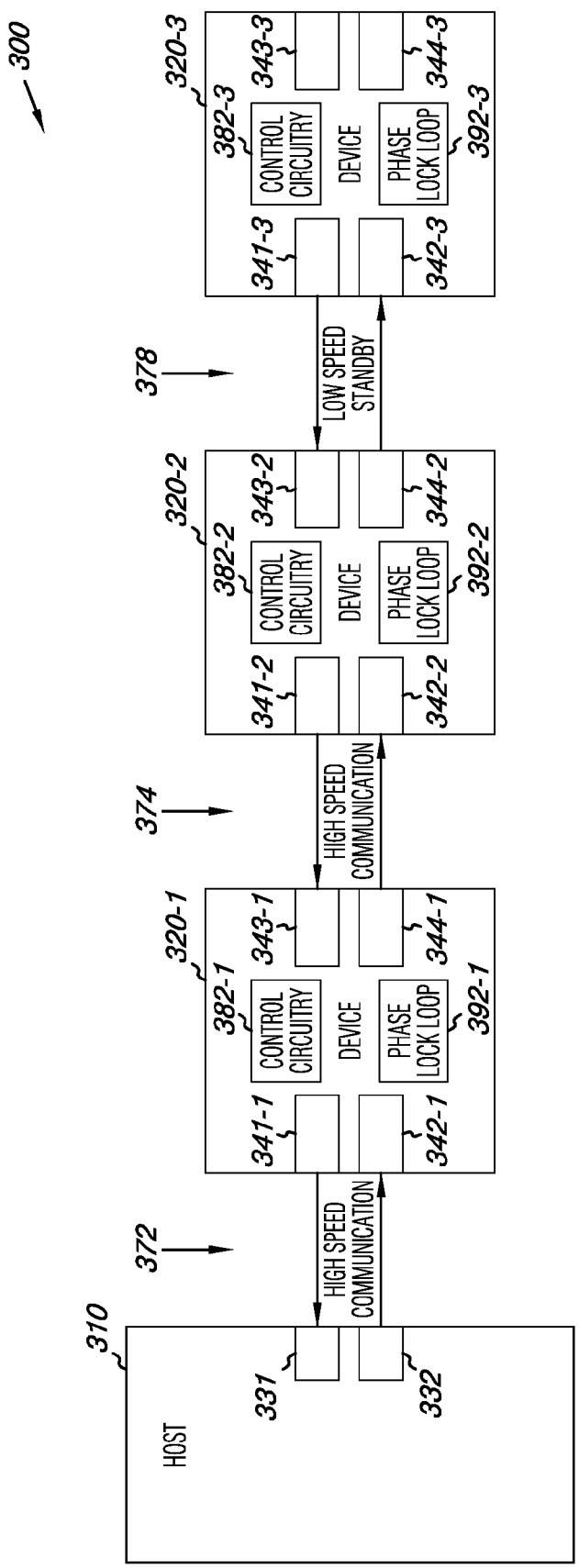
Figure 3D:
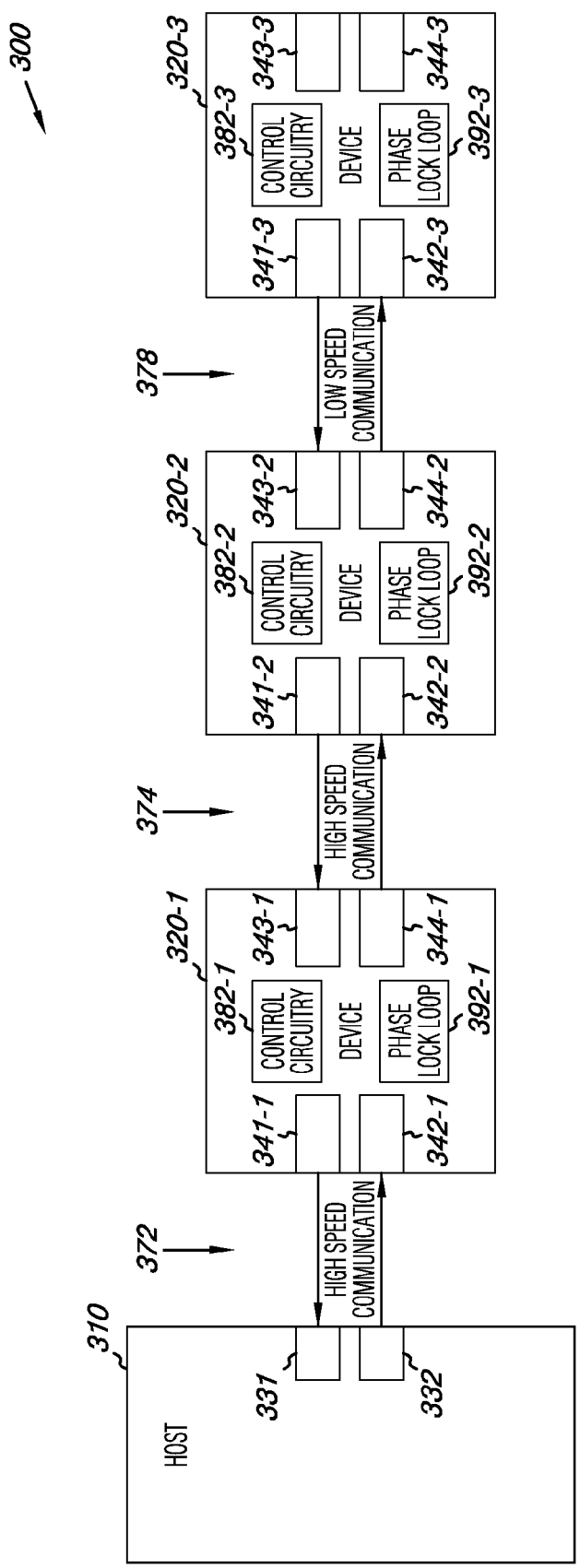
Figure 3E:
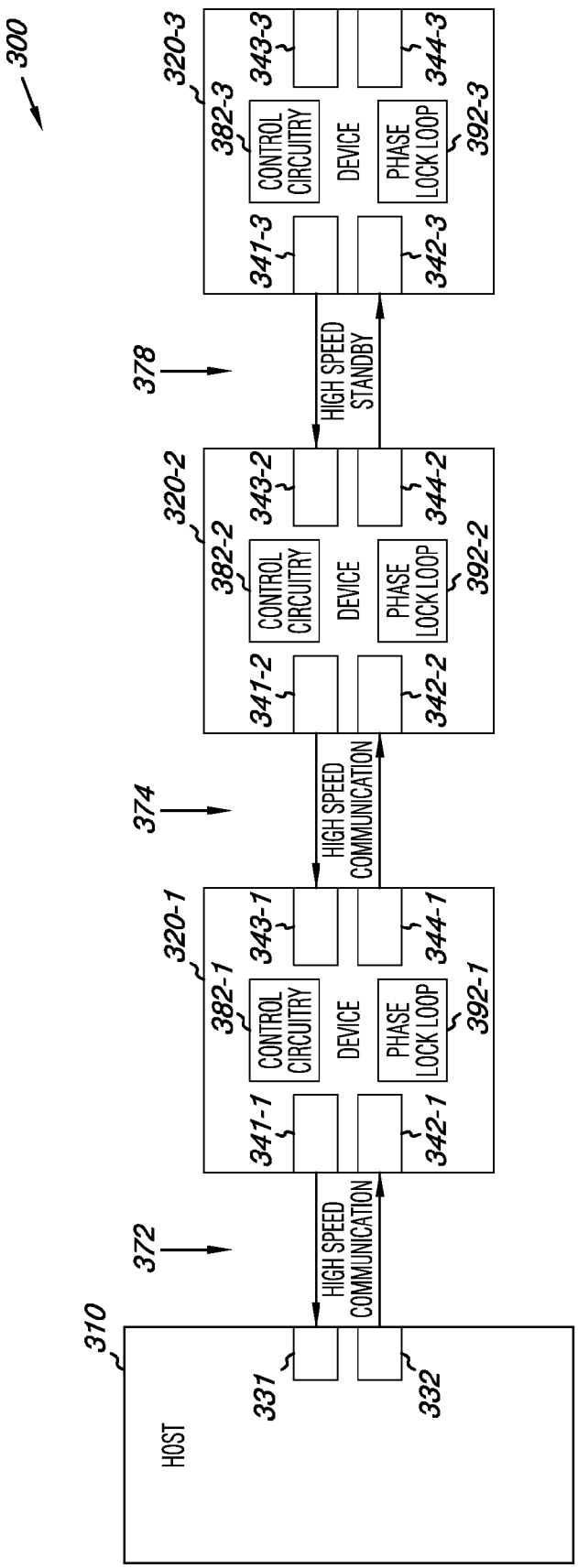
Figure 3F:
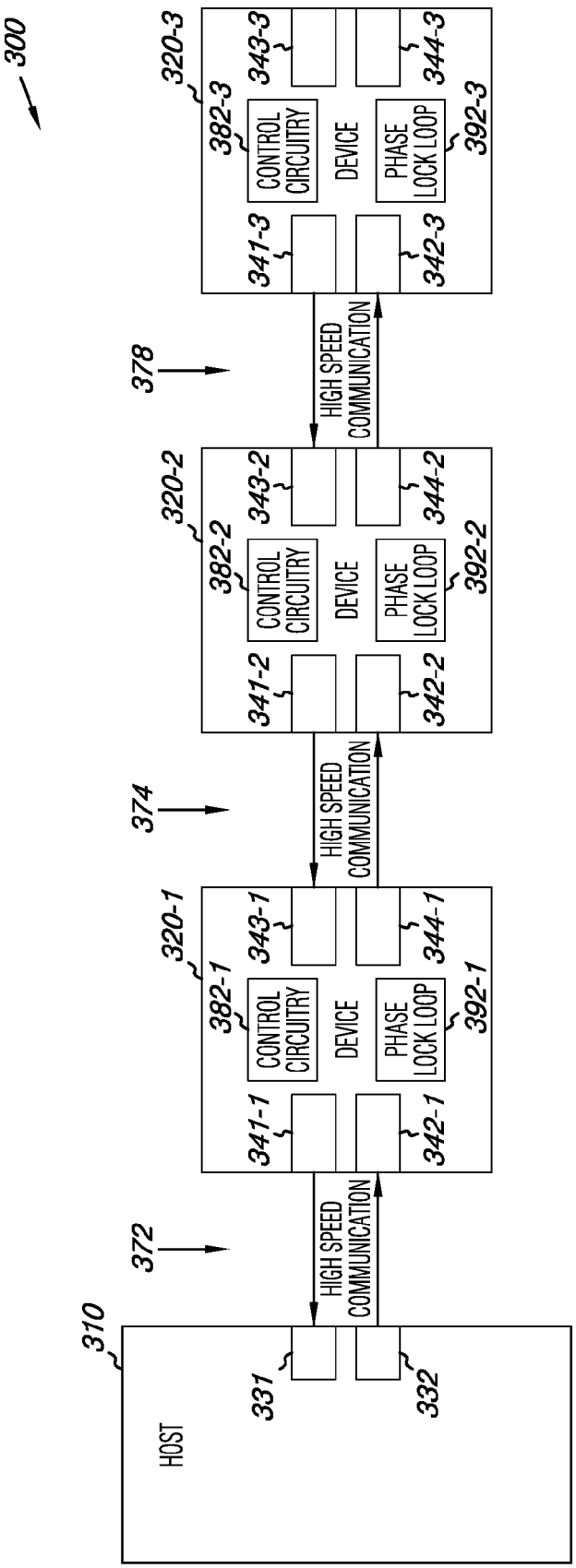

In the embodiment illustrated in FIG. 3A, link 372 is in a high speed communication state, link 374 is in a low speed communication state, and link 378 is in a low speed standby state. Such a configuration may reduce the amount of power used by system 300, because two of the three links are in a low speed state. However, it may be desirable to increase the speed at which system 300 operates, e.g., to increase the speed at which information is communicated in system 300.

Host 310 can send a first command to devices 320-1 and 320-2, e.g., host 310 can send the first command to device 320-1, which can send the first command to device 320-2. The first command can include a command to change link 374, e.g., downstream input port 343-1, downstream output port 344-1, upstream output port 341-2, and upstream input port 342-2, from the low speed communication state to a high speed standby state. Responsive to receipt of the first command by device 320-1, control circuitry 382-1 can change downstream input port 343-1 and downstream output port 344-1 from the low speed communication state to the high speed standby state. Responsive to receipt of the first command by device 320-2, control circuitry 382-2 can change upstream output port 341-2 and upstream input port 342-2 from the low speed communication state to the high speed standby state. That is, responsive to the first command, link 374 can change from the low speed communication state to the high speed standby state, as shown in the embodiment illustrated in FIG. 3B.

Host 310 may be aware of an amount of time associated with changing link 374 from the low speed communication state to the high speed standby state. For example, host 310 can include a host memory (not shown), which can include information associated with the amount of time associated with changing link 374 from the low speed communication state to the high speed standby state. Host 310 can send a second command to devices 320-1 and 320-2, e.g., host 310 can send the second command to device 320-1, which can send the second command to device 320-2, responsive to an expiration of the amount of time. The second command can include a command to change link 374 from the high speed standby state to a high speed communication state.

Responsive to receipt of the second command by device 320-1, control circuitry 382-1 can change downstream input port 343-1 and downstream output port 344-1 from the high speed standby state to the high speed communication state. Responsive to receipt of the second command by device 320-2, control circuitry 382-2 can change upstream output port 341-2 and upstream input port 342-2 from the high speed standby state to the high speed communication state. That is, responsive to the second command, link 374 can change from the high speed standby state to the high speed communication state, as shown in the embodiment illustrated in FIG. 3C.

Changing the state of link 374 in such a manner, e.g., changing link 374 from the low speed communication state to the high speed standby state and then changing link 374 from the high speed standby state to the high speed communication state, can provide the input and output ports associated with link 374 with time to stabilize between each state change. In contrast, if, for example, link 374 were to change directly from the low speed communication state to the high speed communication state, the input and output ports associated with link 374 may not be able to stabilize.

Host 310 may be aware of an amount of time associated with changing link 374 from the high speed standby state to the high speed communication state. For example, host 310 can include a host memory (not shown), which can include information associated with the amount of time associated with changing link 374 from the high speed standby state to the high speed communication state. Host 310 can send a third command to devices 320-2 and 320-3, e.g., host 310 can send the third command to device 320-1, which can send the third command to device 320-2, which can send the third command to device 320-3, responsive to an expiration of the amount of time. The third command can include a command to change link 378 from the low speed standby state to the low speed communication state.

Responsive to receipt of the third command by device 320-2, control circuitry 382-2 can change downstream input port 343-2 and downstream output port 344-2 from the low speed standby state to the low speed communication state. Responsive to receipt of the third command by device 320-3, control circuitry 382-3 can change upstream output port 341-3 and upstream input port 342-3 from the low speed standby state to the low speed communication state. That is, responsive to the third command, link 378 can change from the low speed standby state to the low speed communication state, as shown in the embodiment illustrated in FIG. 3D.

Host 310 may be aware of an amount of time associated with changing link 378 from the low speed standby state to the low speed communication state. For example, host 310 can include a host memory (not shown), which can include information associated with the amount of time associated with changing link 378 from the low speed standby state to the low speed communication state. Host 310 can send a fourth command to devices 320-2 and 320-3, e.g., host 310 can send the fourth command to device 320-1, which can send the fourth command to device 320-2, which can send the fourth command to device 320-3, responsive to an expiration of the amount of time. The fourth command can include a command to change link 378 from the low speed communication state to the high speed standby state.

Responsive to receipt of the fourth command by device 320-2, control circuitry 382-2 can change downstream input port 343-2 and downstream output port 344-2 from the low speed communication state to the high speed standby state. Responsive to receipt of the fourth command by device 320-3, control circuitry 382-3 can change upstream output port 341-3 and upstream input port 342-3 from the low speed communication state to the high speed standby state. That is, responsive to the fourth command, link 378 can change from the low speed communication state to the high speed standby state, as shown in the embodiment illustrated in FIG. 3E.

Host 310 may be aware of an amount of time associated with changing link 378 from the low speed communication state to the high speed standby state. For example, host 310 can include a host memory (not shown), which can include information associated with the amount of time associated with changing link 378 from the low speed communication state to the high speed standby state. Host 310 can send a fifth command to devices 320-2 and 320-3, e.g., host 310 can send the fifth command to device 320-1, which can send the fifth command to device 320-2, which can send the fifth command to device 320-3, responsive to an expiration of the amount of time. The fifth command can include a command to change link 378 from the high speed standby state to the high speed communication state.

Responsive to receipt of the fifth command by device 320-2, control circuitry 382-2 can change downstream input port 343-2 and downstream output port 344-2 from the high speed standby state to the high speed communication state. Responsive to receipt of the fifth command by device 320-3, control circuitry 382-3 can change upstream output port 341-3 and upstream input port 342-3 from the high speed standby state to the high speed communication state. That is, responsive to the fifth command, link 378 can change from the high speed standby state to the high speed communication state, as shown in the embodiment illustrated in FIG. 3F.

Changing the state of link 378 in such a manner, e.g., changing link 378 from the low speed standby state to the low speed communication state, then changing link 378 from the low speed communication state to the high speed standby state, and then changing link 378 from the high speed standby state to the high speed communication state, can provide the input and output ports associated with link 378 with time to stabilize between each state change. In contrast, if, for example, link 378 were to change directly from the low speed standby state to the high speed communication state, the input and output ports associated with link 378 may not be able to stabilize.

As previously described herein, host 310 may be aware of the amount of time associated with a number of state changes of links 374 and/or 378, and host 310 may send a number of commands to change the state of links 374 and/or 378 to devices 320-1, 320-2, and/or 320-3 responsive to an expiration of the amount of time. That is, host 310 may send the number of commands to change the state of links 374 and/or 378 without receiving, e.g., without waiting for, an acknowledgement from devices 320-1, 320-2, and/or 320-3 of a previous command to change the state of links 374 and/or 378.

This can reduce the amount of time associated with changing the state of links 374 and/or 378 to a high speed communication state, e.g., can reduce the amount of time system 300 is idle as the state of links 374 and/or 378 are changed to the high speed communication state. This can also reduce the uncertainty of the amount of time associated with changing the state of links 374 and/or 378 to the high speed communication state, e.g., can fix the amount of time associated with changing the state of links 374 and/or 378 to the high speed communication state.

In a number of embodiments in which devices 320-1, 320-2, and 320-3 are memory devices, control circuitries 382-1, 382-2, and 382-3 can be used to facilitate operations, such as read, write, and/or erase commands, among other operations, that are communicated to devices 320-1, 320-2, and 320-3 from host 310, as previously described in connection with FIG. 1. Additionally, the embodiments illustrated in FIGS. 3A-3F can include additional circuitry that is not illustrated so as not to obscure embodiments of the present disclosure, as previously described in connection with FIG. 1.

Figure 4A:
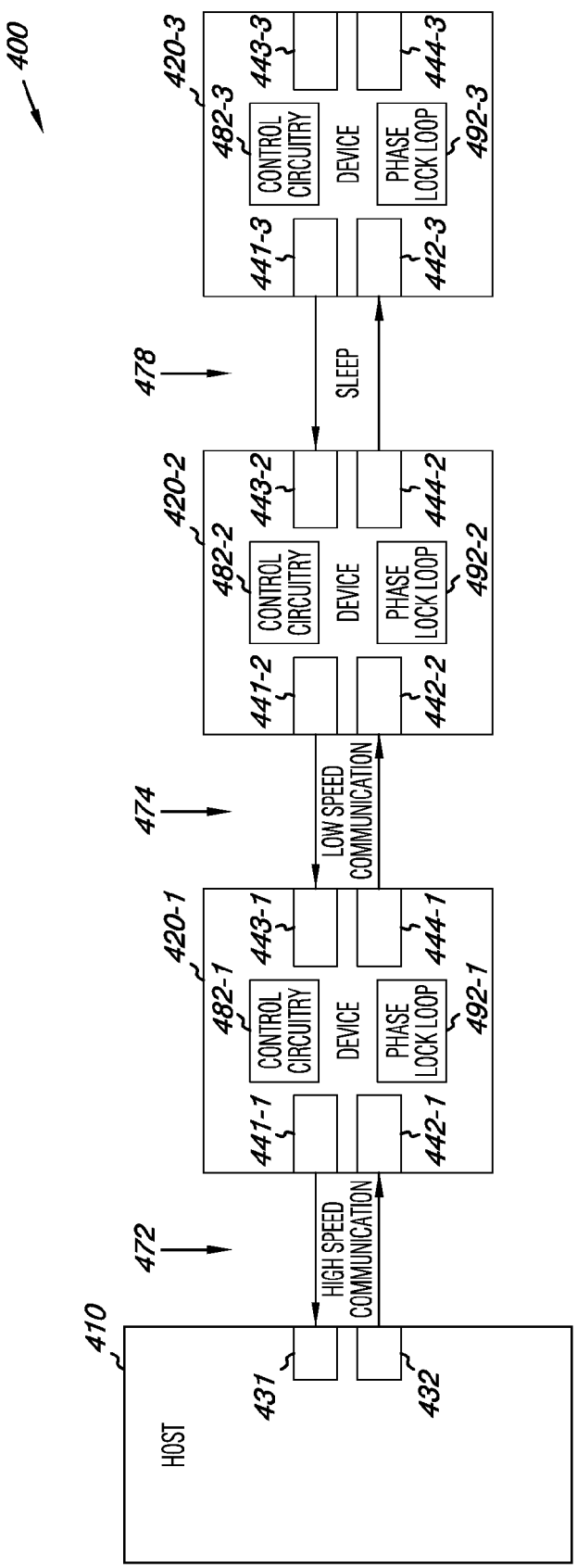
FIGS. 4A-4C illustrate a block diagram of a system in accordance with a number of embodiments of the present disclosure.
Figure 4B:
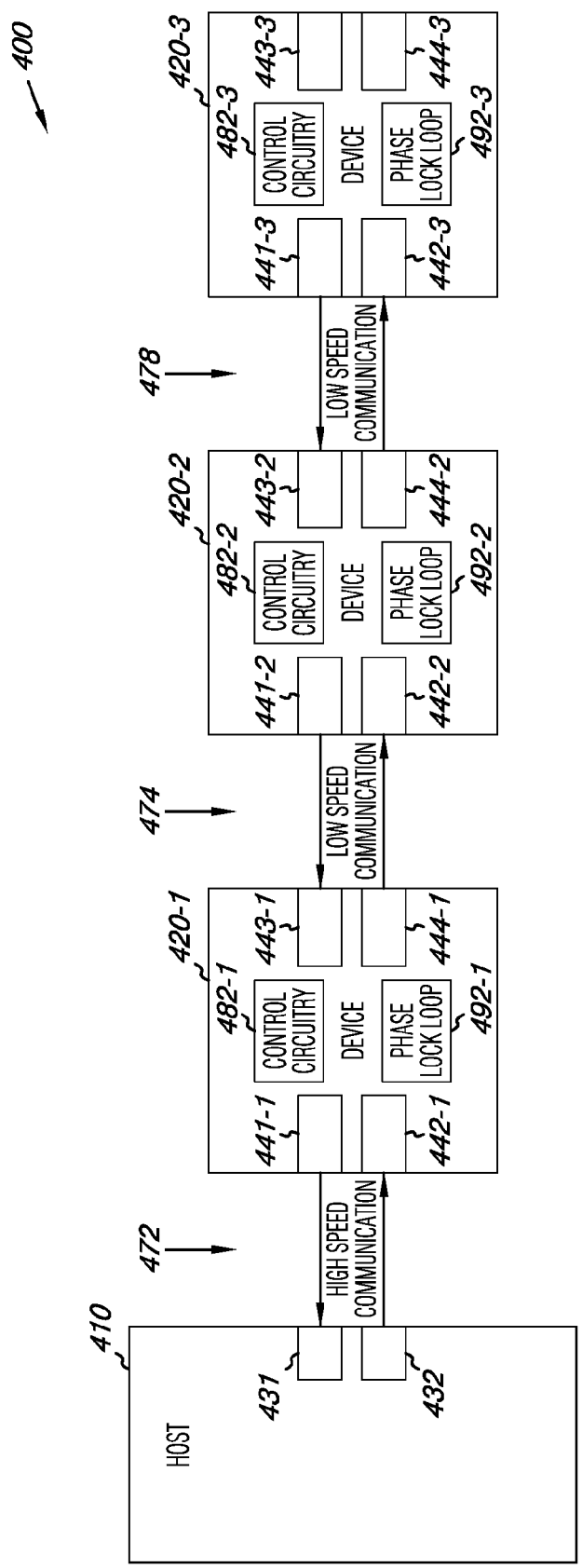
Figure 4C:
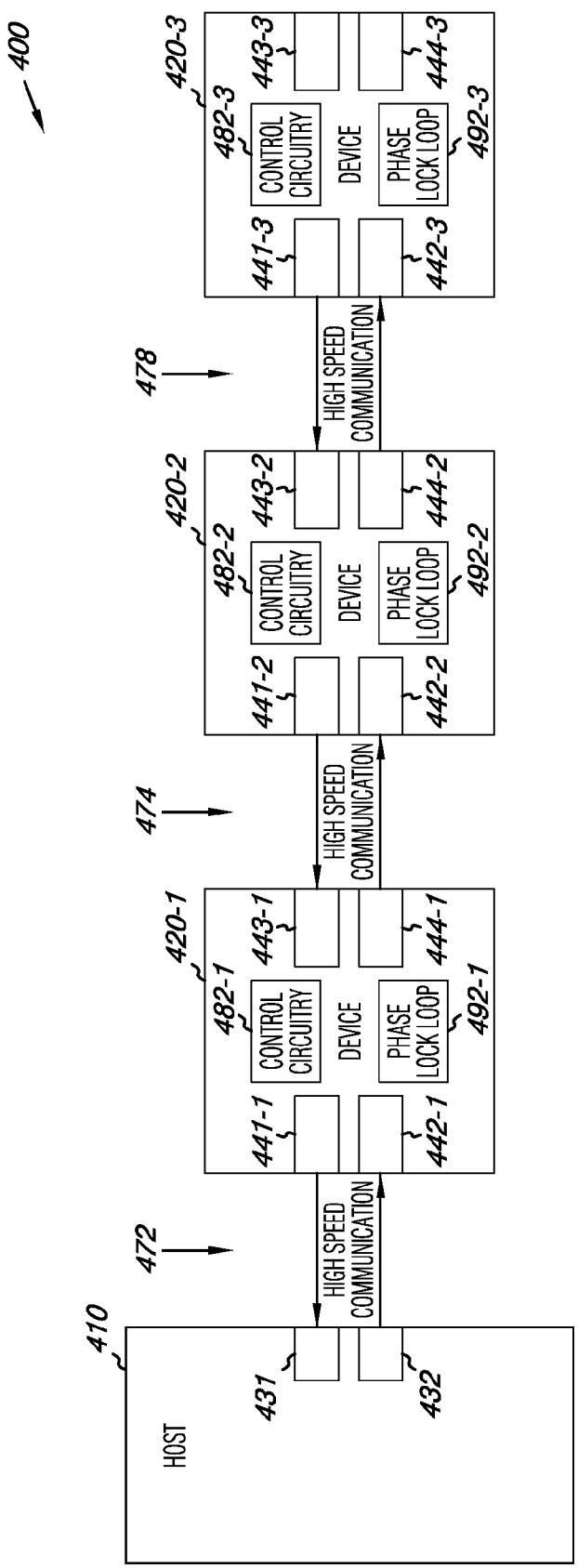

FIGS. 4A-4C illustrate a block diagram of a system 400 in accordance with a number of embodiments of the present disclosure. System 400 can be, for example, a memory system. As shown in FIGS. 4A-4C, system 400 includes host 410 and devices 420-1, 420-2, and 420-3. Devices 420-1, 420-2, and 420-3 can be memory devices, non-memory devices, removable devices, and/or peripheral devices, among other types of devices. Host 410 can be analogous to host 110 shown in FIG. 1, and can include elements analogous to the elements included in host 110. For example, as shown in FIGS. 4A-4C, host 410 includes host input port 431 and host output port 432.

As shown in FIGS. 4A-4C, devices 420-1, 420-2, and 420-3 are coupled to host 410, e.g., host input port 431 and host output port 432, in a chained configuration analogous to that previously described in connection with FIG. 2. Information, e.g., control, address, data, instructions, commands, and other signals, can be communicated between host 410 and devices 420-1, 420-2, and 420-3 in a manner, e.g., in both a downstream and upstream manner, analogous to that previously described in connection with FIG. 1.

As shown in FIGS. 4A-4C, device 420-1 includes upstream output port 441-1, upstream input port 442-1, downstream input port 443-1, and downstream output port 444-1. Device 420-2 includes upstream output port 441-2, upstream input port 442-2, downstream input port 443-2, and downstream output port 444-2. Device 420-3 includes upstream output port 441-3, upstream input port 442-3, downstream input port 443-3, and downstream output port 444-3. Downstream input port 443-3 and downstream output port 444-3 can be in an off state. Each device can use its respective upstream and downstream input and output port during downstream and upstream communication in a manner analogous to that previously described in connection with FIG. 1.

As shown in FIGS. 4A-4C, device 420-1 includes control circuitry 482-1 and phase lock loop 492, device 420-2 includes control circuitry 482-2 and phase lock loop 492-2, and device 420-3 includes control circuitry 482-3 and phase lock loop 492-3. The control circuitries and phase lock loops shown in FIGS. 4A-4C can be analogous to the control circuitries and phase lock loops previously described in connection with FIG. 1. Additionally, system 400 includes links 472, 474, and 478, as shown in FIGS. 4A-4C.

In the embodiment illustrated in FIG. 4A, device 420-1 is in a step down bypass state, device 420-2 is in a low speed stop state, and device 420-3 is in a sleep state. That is, upstream output port 441-1 and upstream input port 442-1 are in a high speed communication state, downstream input port 443-1, downstream output port 444-1, upstream output port 441-2, and upstream input port 442-2 are in a low speed communication state, and downstream input port 443-2, downstream output port 444-2, upstream output port 441-3, and upstream input port 442-3 are in a sleep state, as shown in FIG. 4A. Such a configuration may reduce the amount of power used by system 400. However, it may be desirable to increase the speed at which system 400 operates, e.g., to increase the speed at which information is communicated in system 400.

Host 410 can send a first command to devices 420-2 and 420-3, e.g., host 410 can send the first command to device 420-1, which can send the first command to device 420-2, which can send the first command to device 420-3. The first command can include a command for device 420-2 to change from the low speed stop state to a low speed bypass state and a command for device 420-3 to change from the sleep state to a low speed last state.

Responsive to receipt of the first command by device 420-2, control circuitry 482-2 can change device 420-2 from the low speed stop state to the low speed bypass state, e.g., control circuitry 482-2 can change downstream input port 443-2 and downstream output port 444-2 from the sleep state to the low speed communication state, as shown in the embodiment illustrated in FIG. 4B. Responsive to receipt of the first command by device 420-3, control circuitry 482-3 can change device 420-3 from the sleep state to the low speed last state, e.g., control circuitry 482-3 can change upstream output port 441-3 and upstream input port 442-3 from the sleep state to the low speed communication state, as shown in the embodiment illustrated in FIG. 4B.

Host 410 may be aware of an amount of time associated with changing device 420-2 from the low speed stop state to the low speed bypass state and changing device 420-3 from the sleep state to the low speed last state. For example, host 410 can include a host memory (not shown), which can include information associated with the amount of time associated with changing device 420-2 from the low speed stop state to the low speed communication state and changing device 420-3 from the sleep state to the low speed last state. Host 410 can send a second command to devices 420-1, 420-2, and 420-3, e.g., host 410 can send the second command to device 420-1, which can send the second command to device 420-2, which can send the second command to device 420-3, responsive to an expiration of the amount of time. The second command can include a command for device 420-1 to change from the step down bypass state to a high speed bypass state, a command for device 420-2 to change from the low speed bypass state to the high speed bypass state, and a command for device 420-3 to change from the low speed last state to a high speed last state.

If host 410 is not aware of the amount of time associated with changing the states of devices 420-2 and 420-3, control circuitry 482-2 can send an acknowledgement of the first command to host 410 responsive to changing device 420-2 from the low speed stop state to the low speed bypass state, and/or control circuitry 482-3 can send an acknowledgement of the first command to host 410 responsive to changing device 420-3 from the sleep state to the low speed last state. Host 410 can then send the second command to devices 420-1, 420-2, and 420-3 responsive to receipt of the acknowledgement(s).

Responsive to receipt of the second command by device 420-1, control circuitry 482-1 can change device 420-1 from the step down bypass state to the high speed bypass state, e.g., control circuitry 482-1 can change downstream input port 443-1 and downstream output port 444-1 from the low speed communication state to the high speed communication state, as shown in the embodiment illustrated in FIG. 4C. Responsive to receipt of the second command by device 420-2, control circuitry 482-2 can change device 420-2 from the low speed bypass state to the high speed bypass state, e.g., control circuitry 482-1 can change upstream output port 441-2, upstream input port 442-2, downstream input port 443-2, and downstream output port 444-2 from the low speed communication state to the high speed communication state, as shown in FIG. 4C. Responsive to receipt of the second command by device 420-3, control circuitry 482-3 can change device 420-3 from the low speed last state to the high speed last state, e.g., control circuitry 482-3 can change upstream output port 441-3 and upstream input port 442-3 from the low speed communication state to the high speed communication state, as shown in FIG. 4C.

By changing the states of devices 420-1, 420-2, and 420-3 in such a manner, e.g., changing device 420-2 from the low speed stop state to the low speed bypass state and device 420-3 from the sleep state to a low speed last state, and then changing device 420-1 from the step down bypass state to the high speed bypass state, a command for device 420-2 to change from the low speed bypass state to the high speed bypass state, and a command for device 420-3 to change from the low speed last state to a high speed last state, the speed associated with the state of each device 420-1, 420-2, and 420-3 may remain as fast or faster than the speed associated with the state of any downstream device throughout the process. For example, the speed associated with the state of device 420-2 may remain as fast as or faster than the speed associated with the state of device 420-3 throughout the process. In contrast, if, for example, device 420-3 were to change directly from the sleep state to the high speed last state, the speed associated with the state of device 420-2 would be slower than the speed associated with the state of device 420-3, e.g., device 420-2 would be in a low speed state and device 420-3 would be in a high speed state. Similarly, if, for example, device 420-2 were to change directly from the low speed stop state to the high speed bypass state, the speed associated with the state of device 420-1 would be slower than the speed associated with the state of device 420-2, e.g., device 420-1 would be in an step down state and device 420-2 would be in a high speed state.

By sending a number of commands that include one or more commands to change the state(s) of devices 420-1, 420-2, and/or 420-3, host 410 may not have to be aware of e.g., recognize, and/or process the state change(s) of the input and output port(s) that are associated with the state change(s) of the device(s). Rather, the state change(s) of the input and output port(s) may be recognized and/or processed by devices 420-1, 420-2, and/or 420-3, e.g., control circuitries 482-1, 482-2, and/or 482-3. For example, to change the state of device 420-2, host 410 may not have to be aware of and/or process the state change(s) of upstream output port 441-2, upstream input port 442-2, downstream input port 443-2, and/or downstream output port 444-2 that are associated with the state change of device 420-2. Rather, the state change(s) of upstream output port 441-2, upstream input port 442-2, downstream input port 443-2, and/or downstream output port 444-2 may be recognized and processed by device 420-2, e.g., control circuitry 482-2. Such a process can increase the amount of memory available to host 410 for other operations, and/or increase the operational speed of host 410 and/or system 400.

Additionally, if devices 420-1, 420-2, and/or 420-3 are different types of devices, one device, e.g., the software driver(s) associated with one device, may not be aware of how to control the state of the other devices. For example, if devices 420-1, 420-2, and/or 420-3 are different types of devices, the software driver(s) associated with device 420-3 may not be aware of how to control the state of devices 420-1 or 420-2. Sending a number of commands that include one or more commands to change the state(s) of devices 420-1, 420-2, and/or 420-3 from host 410, however, can allow one device to control the state(s) of the other devices. For example, sending a number of commands that include one or more commands to change the state(s) of devices 420-1, 420-2, and/or 420-3 from host 410 can allow the software driver(s) associated with device 420-3 to control the state(s) of devices 420-1 and/or 420-2.

In a number of embodiments in which devices 420-1, 420-2, and 420-3 are memory devices, control circuitries 482-1, 482-2, and 482-3 can be used to facilitate operations, such as read, write, and/or erase commands, among other operations, that are communicated to devices 420-1, 420-2, and 420-3 from host 410, as previously described in connection with FIG. 1. Additionally, the embodiments illustrated in FIGS. 4A-4C can include additional circuitry that is not illustrated so as not to obscure embodiments of the present disclosure, as previously described in connection with FIG. 1.

CONCLUSION

The present disclosure includes methods, devices, and systems for state change in systems having devices coupled in a chained configuration. A number of embodiments include a host and a number of devices coupled to the host in a chained configuration. The chained configuration includes at least one device that is not directly coupled to the host. The at least one device that is not directly coupled to the host is configured to change from a first communication state to a second communication state responsive to receipt of a command from the host.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a host; and
a number of devices coupled to the host in a chained configuration, wherein:
the chained configuration includes:
a first device that is directly coupled to the host;
a second device that is directly coupled to the first device and not directly coupled to the host, wherein the second device includes:
a first input port and a first output port configured to change from a first state to a second state responsive to a first command from the host; and
a second input port and a second output port configured to change from a first state to a second state responsive to a second command from the host; and
a third device that is directly coupled to the second device and not directly coupled to the host;
wherein at least one of the second and third device is configured to change from a first communication state to a second communication state responsive to receipt of a command from the host, wherein the first communication state is a low speed communication state and the second communication state is a high speed communication state.

2. The system of claim 1, wherein:
the third device includes an input port and an output port; and
the third device is configured to change the input port and the output port of the third device from a first state to a second state responsive to receipt of the command from the host.

3. The system of claim 2, wherein the third device is configured to change the input port and the output port from a low speed state to a high speed state responsive to receipt of the command from the host.

4. The system of claim 2, wherein the host is not aware of a change of the input port and the output port of the third device from the first state to the second state.

5. The system of claim 1, wherein the at least one of the second and third device is configured to change from the second communication state to a third communication state responsive to receipt of an additional command from the host.

6. The system of claim 5, wherein the host is configured to send the additional command to the at least one of the second and third device without receiving an acknowledgement of the command.

7. The system of claim 5, wherein:
the at least one of the second and third device is configured to send an acknowledgement of the command to the host responsive to the change of the at least one of the second and third device from the first communication state to the second communication state; and
the host is configured to send the additional command to the at least one of the second and third device responsive to receipt of the acknowledgement.

8. The system of claim 5, wherein:
the host is aware of an amount of time associated with a change of the at least one of the second and third device from the first communication state to the second communication state; and
the host is configured to send the additional command to the at least one of the second and third device responsive to an expiration of the amount of time.

9. The system of claim 1, wherein each of the devices in the chained configuration are configured to communicate information at a rate in a first communication state that is as fast as or faster than an information communication rate of any downstream device in a second communication state in the chained configuration.

10. The system of claim 1, wherein:
the at least one of the second and third device is configured to use a first amount of power while in the first communication state; and
the at least one of the second and third device is configured to use a second amount of power while in the second communication state;
wherein the first amount of power is different than the second amount of power.

11. A method for operating a system, comprising:
receiving, by a device, a command from a host, wherein:
the device is coupled to the host in a chained configuration, wherein the chained configuration includes:
a first device that is directly coupled to the host;
a second device that is directly coupled to the first device and not directly coupled to the host, wherein the second device includes:
a first input port and a first output port configured to change from a first state to a second state responsive to a first command from the host; and
a second input port and a second output port configured to change from a first state to a second state responsive to a second command from the host; and
a third device that is directly coupled to the second device and not directly coupled to the host; and
the device is not directly coupled to the host; and
changing a state of an input port and an output port of the device from a first communication state to a second communication state responsive to the command, wherein the first communication state is a low speed communication state and the second communication state is a high speed communication state.

12. The method of claim 11, wherein the method includes:
sending an acknowledgement of the command from the device to the host responsive to changing the state of the input port and the output port of the device;
receiving, by the device, an additional command from the host responsive to the acknowledgement; and
changing the state of the input port and the output port of the device responsive to the additional command.

13. The method of claim 11, wherein the method includes:
receiving, by the device, an additional command from the host responsive to an expiration of an amount of time associated with changing the state of the input port and the output port of the device; and
changing the state of the input port and the output port of the device responsive to the additional command.

14. The method of claim 11, wherein the method includes:
receiving, by the device, an additional command from the host without sending an acknowledgement of the command from the device to the host responsive to changing the state of the input port and the output port of the device; and
changing the state of the input port and the output port of the device responsive to the additional command.

15. A method for operating a system, comprising:
receiving, by a device, a command from a host, wherein:
the device is coupled to the host in a chained configuration, wherein the chained configuration includes:
a first device that is directly coupled to the host;

a second device that is directly coupled to the first device and not directly coupled to the host, wherein the second device includes:
a first input port and a first output port configured to change from a first state to a second state responsive to a first command from the host; and
a second input port and a second output port configured to change from a first state to a second state responsive to a second command from the host; and
a third device that is directly coupled to the second device and not directly coupled to the host; and
the device is not directly coupled to the host; and
changing a communication state of the device from a first communication state to a second communication state responsive to the command, wherein the first communication state is a low speed communication state and the second communication state is a high speed communication state.

16. The method of claim 15, wherein changing the communication state of the device includes changing a state of an input port and an output port of the device.

17. The method of claim 16, wherein the host is not aware of the state change of the input port and the output port of the device.

18. The method of claim 15, wherein the method includes:
receiving, by the device, an additional command from the host; and
changing the communication state of the device responsive to the additional command.

19. The method of claim 18, wherein:
changing the communication state of the device responsive to the command includes:
changing a state of an output port of the device from a sleep state to a low speed state;
changing the state of the output port of the device from the low speed state to a high speed state; and
changing the state of an input port of the device from a low speed state to a high speed state.

20. The method of claim 18, wherein the additional command from the host is received responsive to an expiration of an amount of time associated with changing the communication state of the device.

21. The method of claim 18, wherein the additional command from the host is received without sending an acknowledgement of the command from the device to the host responsive to changing the communication state of the device.

22. The method of claim 15, wherein receiving the command from the host includes:
receiving, by an additional device, the command from the host, wherein the host is directly coupled to the additional device; and
receiving, by the device, the command from the additional device, wherein the additional device is directly coupled to the device.

* * * * *